(12) United States Patent
Boogaard et al.

(10) Patent No.: US 8,830,446 B2
(45) Date of Patent: *Sep. 9, 2014

(54) EXPOSURE APPARATUS

(71) Applicant: ASML Netherlands B.V., Veldhoven (NL)

(72) Inventors: Arjen Boogaard, Deventer (NL); Timotheus Franciscus Sengers, 's-Hertogenbosch (NL); Wilhelmus Sebastianus Marcus Maria Ketelaars, Eindhoven (NL); Carolus Ida Maria Antonius Spee, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/928,203

(22) Filed: Jun. 26, 2013

(65) Prior Publication Data

US 2013/0286374 A1  Oct. 31, 2013

Related U.S. Application Data

(63) Continuation of application No. 12/232,967, filed on Sep. 26, 2008, now Pat. No. 8,542,341, which is a continuation of application No. 11/033,485, filed on Jan. 12, 2005, now Pat. No. 7,450,217.

(51) Int. Cl.
*G03B 27/42* (2006.01)
*G03B 27/52* (2006.01)
*G03F 7/20* (2006.01)

(52) U.S. Cl.
CPC ........... *G03F 7/70058* (2013.01); *G03B 27/42* (2013.01); *G03F 7/70716* (2013.01); *G03F 7/70916* (2013.01); *G03F 7/7085* (2013.01); *G03F 7/70958* (2013.01)
USPC ............................................. 355/53; 355/30

(58) Field of Classification Search
USPC ......... 350/30, 53, 55, 67, 72; 250/548, 492.2; 356/399–401
See application file for complete search history.

(56) References Cited

U.S. PATENT DOCUMENTS

| 4,346,164 A | 8/1982 | Tabarelli et al. |
| 4,480,910 A | 11/1984 | Takanashi et al. |

(Continued)

FOREIGN PATENT DOCUMENTS

| DE | 221563 A1 | 4/1985 |
| DE | 224448 A1 | 7/1985 |

(Continued)

OTHER PUBLICATIONS

Preliminary Amendment filed in U.S. Appl. No. 11/822,964, dated Jul. 11, 2007.

(Continued)

*Primary Examiner* — Hung Henry Nguyen
(74) *Attorney, Agent, or Firm* — Pillsbury Winthrop Shaw Pittman LLP

(57) ABSTRACT

An extreme ultraviolet exposure apparatus includes a radiation system configured to supply a beam of extreme ultraviolet radiation; a support configured to support a patterning device, the patterning device configured to pattern the beam of extreme ultraviolet radiation according to a desired pattern; a substrate table having an area configured to support a substrate; a projection system configured to project the patterned beam of extreme ultraviolet radiation onto a target portion of the substrate, the projection system comprising a reflective optical system; wherein at least a part of the apparatus that during use of the apparatus is exposed to the beam of extreme ultraviolet radiation is coated with a coating, the coating comprising a metal oxide, or a photocatalyst, or a semiconductor, or any combination thereof.

22 Claims, 2 Drawing Sheets

(56) References Cited

U.S. PATENT DOCUMENTS

| | | | |
|---|---|---|---|
| 4,509,852 A | 4/1985 | Tabarelli et al. | |
| 4,540,277 A | 9/1985 | Mayer et al. | |
| 5,144,363 A | 9/1992 | Wittekoek et al. | |
| 5,481,362 A | 1/1996 | Van Den Brink et al. | |
| 5,527,562 A | 6/1996 | Balaba et al. | |
| 5,528,118 A | 6/1996 | Lee | |
| 5,610,683 A | 3/1997 | Takahashi | |
| 5,623,853 A | 4/1997 | Novak et al. | |
| 5,715,039 A | 2/1998 | Fukuda et al. | |
| 5,808,715 A | 9/1998 | Tsai et al. | |
| 5,825,043 A | 10/1998 | Suwa | |
| 5,874,820 A | 2/1999 | Lee | |
| 6,268,904 B1 | 7/2001 | Mori et al. | |
| 6,297,876 B1 | 10/2001 | Bornebroek | |
| 6,307,620 B1 | 10/2001 | Takabayashi et al. | |
| 6,383,629 B1 | 5/2002 | Tsai et al. | |
| 6,480,260 B1 | 11/2002 | Donders et al. | |
| 6,496,257 B1 | 12/2002 | Taniguchi et al. | |
| 6,674,510 B1 | 1/2004 | Jasper et al. | |
| 6,710,849 B2 | 3/2004 | Kwan et al. | |
| 6,717,651 B2 | 4/2004 | Kato et al. | |
| 6,724,462 B1 | 4/2004 | Singh et al. | |
| 6,741,331 B2 | 5/2004 | Boonman et al. | |
| 6,778,257 B2 | 8/2004 | Bleeker et al. | |
| 6,884,984 B2 | 4/2005 | Ye et al. | |
| 6,931,097 B1* | 8/2005 | Davis et al. | 378/84 |
| 7,105,419 B2 | 9/2006 | Hiramatsu et al. | |
| 7,199,858 B2 | 4/2007 | Lof et al. | |
| 7,221,431 B2* | 5/2007 | Ohsaki | 355/53 |
| 7,259,828 B2 | 8/2007 | Tolsma et al. | |
| 7,405,805 B2 | 7/2008 | Uitterdijk et al. | |
| 7,450,217 B2* | 11/2008 | Boogaard et al. | 355/53 |
| 7,460,206 B2 | 12/2008 | Weissenrieder et al. | |
| 7,466,392 B2 | 12/2008 | Nagasaka et al. | |
| 7,515,246 B2 | 4/2009 | Nagasaka et al. | |
| 7,835,087 B2 | 11/2010 | Hosoe et al. | |
| 8,208,123 B2* | 6/2012 | Loopstra et al. | 355/67 |
| 2002/0026878 A1 | 3/2002 | Kwan et al. | |
| 2003/0066975 A1 | 4/2003 | Okada | |
| 2004/0025733 A1 | 2/2004 | Kurt et al. | |
| 2004/0119954 A1 | 6/2004 | Kawashima et al. | |
| 2004/0136494 A1 | 7/2004 | Lof et al. | |
| 2004/0160582 A1 | 8/2004 | Lof et al. | |
| 2004/0165159 A1 | 8/2004 | Lof et al. | |
| 2004/0207824 A1 | 10/2004 | Lof et al. | |
| 2004/0251430 A1* | 12/2004 | Sandstrom | 250/492.2 |
| 2005/0024609 A1 | 2/2005 | De Smit et al. | |
| 2005/0025108 A1 | 2/2005 | Dillinger et al. | |
| 2006/0028626 A1 | 2/2006 | Chang et al. | |
| 2006/0028628 A1 | 2/2006 | Lin et al. | |
| 2006/0077367 A1 | 4/2006 | Kobayashi et al. | |
| 2006/0119809 A1 | 6/2006 | Verhagen et al. | |
| 2006/0132731 A1 | 6/2006 | Jansen et al. | |
| 2006/0170891 A1 | 8/2006 | Nishinaga et al. | |
| 2007/0258072 A1 | 11/2007 | Nagasaka et al. | |
| 2008/0038458 A1 | 2/2008 | Gemici et al. | |
| 2008/0073602 A1 | 3/2008 | Jacobs et al. | |
| 2008/0252865 A1 | 10/2008 | Nagasaka et al. | |
| 2009/0225286 A1 | 9/2009 | Nagasaka et al. | |

FOREIGN PATENT DOCUMENTS

| | | |
|---|---|---|
| EP | 0 467 445 | 1/1992 |
| EP | 0 906 590 | 4/1999 |
| EP | 1 420 300 | 5/2004 |
| JP | 57-117238 | 7/1982 |
| JP | 58-202448 | 11/1983 |
| JP | 59-019912 | 2/1984 |
| JP | 62-065326 | 3/1987 |
| JP | 62-183522 | 8/1987 |
| JP | 63-157419 | 6/1988 |
| JP | 04-65603 | 3/1992 |
| JP | 04-305915 | 10/1992 |
| JP | 04-305917 | 10/1992 |
| JP | 05-62877 | 3/1993 |
| JP | 06-53120 | 2/1994 |
| JP | 06-124873 | 5/1994 |
| JP | 06-188169 | 7/1994 |
| JP | 07-176468 | 7/1995 |
| JP | 07-220990 | 8/1995 |
| JP | 08-37149 | 2/1996 |
| JP | 08-166475 | 6/1996 |
| JP | 08-316125 | 11/1996 |
| JP | 08-330224 | 12/1996 |
| JP | 10-163099 | 6/1998 |
| JP | 10-214783 | 8/1998 |
| JP | 10-256116 | 9/1998 |
| JP | 10-303114 | 11/1998 |
| JP | 10-340846 | 12/1998 |
| JP | 11-16816 | 1/1999 |
| JP | 11-111587 | 4/1999 |
| JP | 11-135400 | 5/1999 |
| JP | 11-176727 | 7/1999 |
| JP | 2000-058436 | 2/2000 |
| JP | 2000-505958 | 5/2000 |
| JP | 2000-311933 | 11/2000 |
| JP | 2000-323404 | 11/2000 |
| JP | 2001-109103 | 4/2001 |
| JP | 2001-196303 | 7/2001 |
| JP | 2002-14005 | 1/2002 |
| JP | 2002-075839 | 3/2002 |
| JP | 2002-158168 | 5/2002 |
| JP | 2003-227898 | 8/2003 |
| JP | 2003-243292 | 8/2003 |
| JP | 2004-122056 | 4/2004 |
| JP | 2004-188314 | 7/2004 |
| JP | 2004-207711 A | 7/2004 |
| JP | 2004-294323 | 10/2004 |
| JP | 2005-072404 | 3/2005 |
| JP | 2005-079222 | 3/2005 |
| JP | 2005-175324 | 6/2005 |
| JP | 2006-165502 | 6/2006 |
| JP | 2006-196898 | 7/2006 |
| JP | 2010-16389 | 1/2010 |
| WO | 01/35168 | 5/2001 |
| WO | 2004/019128 | 3/2004 |
| WO | 2004/051717 | 6/2004 |
| WO | 2004/053956 | 6/2004 |
| WO | 2005/031799 | 9/2004 |
| WO | 2004/093130 | 10/2004 |
| WO | 2004/093160 | 10/2004 |
| WO | 2004/105107 | 12/2004 |
| WO | 2005/064405 | 7/2005 |
| WO | WO 99/49504 | 10/2005 |
| WO | 2005/124833 | 12/2005 |

OTHER PUBLICATIONS

Office Action issued for U.S. Appl. No. 11/822,964, dated Dec. 5, 2007.

Information Disclosure Statement filed in U.S. Appl. No. 11/822,964, dated Jul. 11, 2007.

Lev Davydov, "Photocatalytic Degradation of Organic Contaminants: Novel Catalysts and Processes," p. 211-236, ( 2001).

"Photocatalytics", Photo-Catalytic Materials. (1999-2004).

S. Takeda, et al. "Photocatalytic TiO2 Thin Film Deposited onto Glass by DC Magnetron Sputtering," p. 707-721.

Watanabe et al. "Recent Issues on Photoactive TiO2 and Advanced Applications for Glass Coatings," p. 697-706.

P.Zeman, et al. "Effect of total and oxygen partial pressures on structure of photocatalytic TiO2 films sputtered on unheated substrate," Surface and Coatings Technology, Elsevier, p. 93-99, ( 2002).

Ikuo Okada, et al. "Mask Contamination Induced by X-Ray Exposure," Jpn. J. Appl. Phys., vol. 37 (No. 12B), p. 6808-6812, (Dec. 1998).

Andrew Mills, et al. "A web-based overview of semiconductor photochemistry-based current commerical applications," Journal of Photochemistry and Photobiology A: Chemistry 152, p. 233-247, ( 2002).

R. Fretwell, et al. "An active, robust and transparent nanocrystalline anatase TiO2 thin film—preparation, characterisation and the kinet-

(56) References Cited

OTHER PUBLICATIONS ics of photodegradation of model pollutants," Journal of Photochemistry and Photobiology, p. 229-240, (2001).
Satoshi Takeda, et al. "Photocatalytic TiO2 thin film deposited onto glass by DC magnetron sputtering," Thin Solid Films 392, p. 338-344, (2001).
Toshihiro Minabe, et al. "TiO2-mediated photodegradation of liquid and solid organic compounds," Journal of Photochemistry and Photobiology, p. 53-62, (2000).
Andrew Mills, et al. "Thick titanium dioxide films for semiconductor photocatalysis," Journal of Photochemistry and Photobiology A: Chemistry, p. 185-194, (2003).
Andrew Mills, et al. "An overview of semiconductor photocatalysis," Journal of Photochemistry and Photobiology A: Chemistry, p. 1-35, (1997).
Makiko Yamagishi, et al. "Thin film TiO2 photocatalyst deposited by reactive magnetron sputtering," Thin Solid Films 442, p. 227-231, (2003).
Y. Paz, et al. "Photooxidative self-cleaning transparent titanium dioxide films on glass," J. Mater. Res., vol. 10 (No. 11), p. 2842-2848, (Nov. 1995).
B.R. Weinberger, et al. "Titanium dioxide photocatalysts produced by reactive magnetron sputtering," Appl. Phys. Lett., vol. 66 (No. 18), p. 2409-2411, (May 1, 1995).
English Translation of Notice of Reasons for Rejection as issued for Japanese Patent Application No. 2006-003343, dated Jan. 7, 2010.
Japanese Office Action for Japanese Patent Application No. 2006-003343, mailed on Nov. 17, 2011.
Japanese Office Action for Japanese Patent Application No. 2009-188713, mailed on Jan. 24, 2012.
Japanese Office Action mailed Sep. 7, 2012 in corresponding Japanese Patent Application No. 2010-161717.
S. Permpoon et al., "Natural and persistent superhydrophilicity of $SiO_2/TiO_2$ and $TiO_2/SiO_2$ bi-layer films", Thin Solid Films 516 (2008) pp. 957-966.
V. Pore et al., "Atomic Layer Depositioon of Photocatalytic $TiO_2$ Thin Films From Titanium Tetramethoxide and Water", Chemical Vapor Deposition, vol. 10, No. 3, (2004) pp. 143-147.
English translation of Official Action issued on Feb. 17, 2009 in Japanese Application No. 2006-003343.
Japanese Office Action mailed May 27, 2013 in corresponding Japanese Patent Application No. 2009-188713.
Japanese Office Action mailed Jul. 3, 2014 in corresponding Japanese Patent Application No. 2012-163657.

* cited by examiner

EXPOSURE APPARATUS

CROSS-REFERENCE TO RELATED APPLICATIONS

This application is a continuation application of U.S. patent application Ser. No. 12/232,967, filed Sep. 26, 2008, now U.S. Pat. No. 8,542,341, which is a continuation application of U.S. patent application Ser. No. 11/033,485, filed Jan. 12, 2005, now U.S. Pat. No. 7,450,217. Both applications are incorporated herein by reference in their entireties.

BACKGROUND OF THE INVENTION

1. Field of the Invention

The inventions relate to coatings for exposure apparatus, a lithographic apparatus, a device manufacturing method, and a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the radiation beam in a given direction (the "scanning" direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs) and other flat panel displays, thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support supports, e.g. bears the weight of, the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the radiation beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion lithography is mentioned in, for example, U.S. Patent Application Publication No. 2004/0119954 A1 and WO 2004/093610.

Use of a liquid, however, may result in stains on, for example, the projection system, the substrate holder, or other parts in the vicinity of the liquid or possible vapors emanating from the liquid. For example, stains may be left on sensors, for example transmission image sensors (TIS) that may be present on the substrate holder, which could lead to inaccuracies in, e.g., aligning a wafer with a mask and/or to a decreased lifetime of these sensors. An aspect of the present invention is to reduce or eliminate the risk of staining on the various parts of the exposure apparatus by the immersion liquid.

Other problems that may arise in exposure apparatus in general is the deposition of contaminants on various parts of the apparatus, for example sensors. Such contaminants may originate from, e.g., outgassing by the photoresist that may be present on the substrate or from components present in the ambient air (including components formed in the ambient air under the influence of the radiation generated by the exposure apparatus). Outgassing may be of particular concern in extreme ultraviolet (EUV) lithography. EUV lithography is mentioned in, e.g., U.S. Pat. No. 6,724,462. The EUV radiation may assist in cracking hydrocarbons that enter the atmosphere as a result of the outgassing, which in turn may lead to undesirable deposition of carbon on nearby surfaces.

Deposition of contaminants may, depending on the location of the deposition, lead to concerns relating to, e.g., the lifetime of various apparatus parts, alignment, leveling, sensor grating deterioration, and/or radiation blocking. An aspect of the present invention is to reduce or eliminate the deposition of contaminants on the various parts of the exposure apparatus.

SUMMARY

The present invention provides coatings for use in an exposure apparatus, for example for coating a sensor on a substrate table. The coating may have a contact angle with water of less than 10°. The coating may have photocatalytic activity, for example a coating including a semiconductor photocatalyst. The coating may include a semiconductor. The coating may also include a metal oxide.

The invention further provides sensors including a protective coating, for example the above-noted coatings.

The present invention also provides lithography apparatuses and lithography methods.

Additional aspects and features of the present invention are set forth in this specification.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
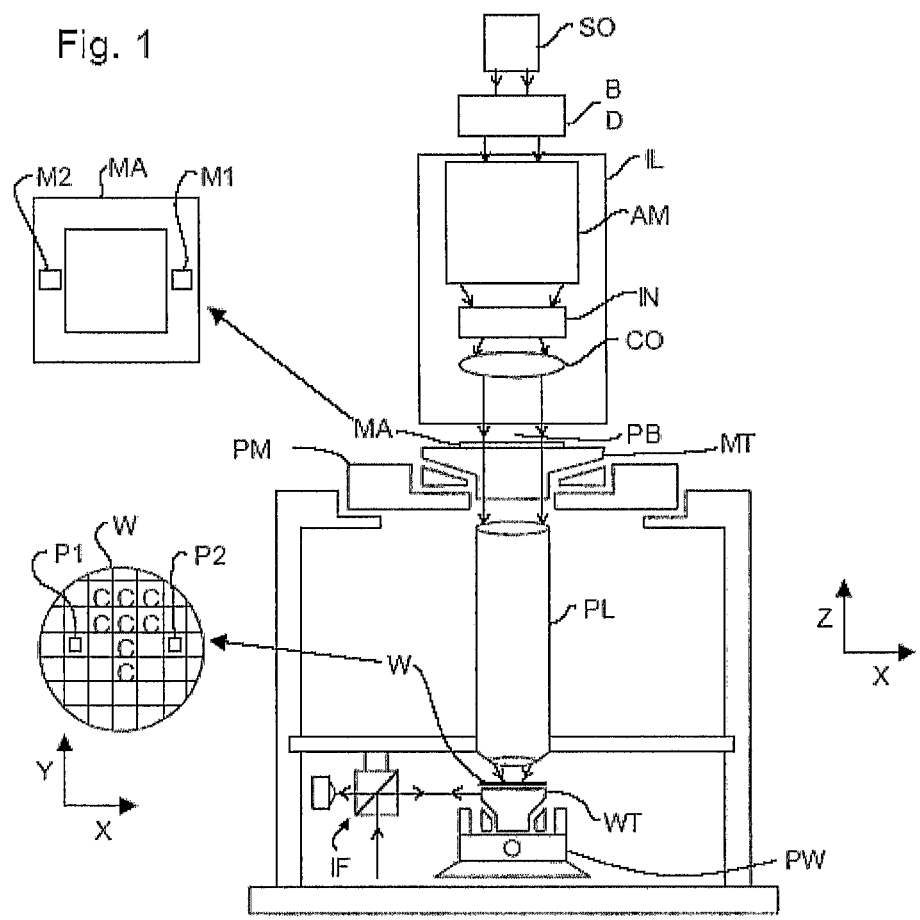
FIG. 1 depicts a lithographic apparatus according to an embodiment of the present invention.

FIG. 1 schematically depicts a lithographic apparatus according to an embodiment of the present invention. The apparatus includes an illumination system (illuminator) IL configured to condition a radiation beam PB (e.g. UV radiation); a first support (e.g. a mask table) MT configured to support a patterning device (e.g. a mask) MA and connected to a first positioning device PM (e.g. including at least one rotary, linear, or planar motor) that accurately positions the patterning device with respect to item PL; a substrate table (e.g. a wafer table) WT configured to hold a substrate (e.g. a resist-coated wafer) W and connected to a second displacement (positioning) device PW (e.g. including at least one rotary, linear, or planar motor) that accurately positions the substrate with respect to a projection system PL (e.g. a refractive projection lens) PL configured to image a pattern imparted to the radiation beam PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD, if required, may be referred to as a radiation system.

The illuminator IL may include an adjusting device AM configured to adjust the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB having a desired uniformity and intensity distribution in its cross-section. In an embodiment, the radiation has a wavelength of at least 5 nm, e.g. at least 100 nm, at least 125 nm, at least 150 nm, at least 190 nm, or at least 220 nm. In an embodiment, the radiation has a wavelength of at most 400 nm, e.g. at most 365 nm, at most 300 nm, at most 260 nm, at most 200 nm, at most 150 nm, at most 100 nm, at most 50 nm, or at most 20 nm.

The radiation beam PB is incident on the mask MA, which is held on the mask table MT. Having traversed the mask MA, the radiation beam PB passes through the projection system PL, which projects the beam onto a target portion C of the substrate W. With the aid of the second positioning device PW and a measurement device (position sensor) IF (e.g. an interferometric or capacitive device and/or encoder), the substrate table WT can be moved accurately, e.g. so as to position different target portions C in the path of the beam PB. Similarly, the first positioning device PM and another position sensor (which is not explicitly depicted in FIG. 1 but which may be an interferometric or capacitive device and/or encoder)) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the radiation beam is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
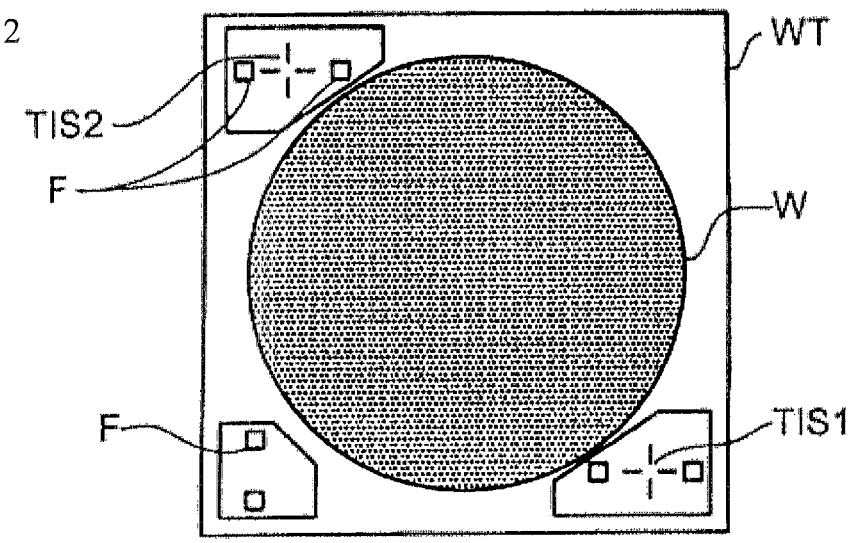
FIG. 2 depicts an embodiment of a substrate table according to the present invention.

FIG. 2 shows an embodiment of a substrate table WT. In the embodiment shown in FIG. 2, two sensors TIS1 and TIS2 are mounted on a fiducial plate mounted to the top surface of the substrate table WT at diagonally opposite positions outside the area covered by the substrate W. The fiducial plate may be made of a highly stable material with a very low coefficient of thermal expansion, e.g. INVAR®, and has a flat reflective upper surface which may carry markers used in alignment processes. Sensors TIS1 and TIS2 are used to determine directly the vertical and horizontal position of the aerial image of the projection system. They include apertures in the respective surface close behind which is placed a photodetector sensitive to the radiation used for the exposure process. To determine the position of the focal plane, the projection system projects into space an image of a TIS pattern TIS-M provided on the mask MA and having contrasting light and dark regions. The substrate table is then scanned horizontally in one or two directions and vertically so that the aperture of the TIS passes through the space where the aerial image is expected to be. As the TIS aperture passes through the light and dark portions of the image of the TIS pattern, the output of the photodetector will fluctuate. The vertical level at which the rate of change of amplitude of the photodetector output is highest indicates the level at which the image of TIS pattern has the greatest contrast and hence indicates the plane of optimum focus. An example of a TIS of this type is described in greater detail in U.S. Pat. No. 4,540,277. Instead of the TIS, a Reflection Image Sensor (RIS) such as that described in U.S. Pat. No. 5,144,363 may also be used. The TIS surface may additionally carry reference markers whose position is detected using a through-the-lens (TTL) alignment system to align the substrate table to the mask. Such an alignment system is described in U.S. Pat. No. 5,481,362, for example. Alignment of individual exposure areas can also be carried out, or may be obviated by an alignment procedure carried out at the measurement stage to align the exposure areas to the reference markers on the wafer stage. Such a procedure is described in U.S. Pat. No. 6,297,876, for example.

As noted earlier, use of a liquid, such as in immersion lithography, may result in stains on parts in an exposure apparatus, for example on sensors, e.g. transmission image sensors. Other problems that may arise in exposure apparatus in general is the deposition of contaminants from the ambient atmosphere on various parts of the apparatus.

In an embodiment, the present invention provides coatings for parts of an exposure apparatus, for example parts of the projection system or parts of the substrate table. In an embodiment, the coatings are used on one or more parts that are exposed to radiation during operation of the apparatus. In an embodiment, the present coatings are used for sensors, for example aberration sensors, radiation dose sensors, transmission image sensors, and/or reflective image sensors. In an embodiment, for example when the coating is used in an immersion lithography apparatus, the coating is exposed to a liquid, e.g. an aqueous liquid, for example water, during operation of the apparatus.

In an embodiment, the present coating includes one or more photocatalysts, for example titanium dioxide and/or zinc oxide. In an embodiment, the photocatalytic coating assists in breaking up contaminants that are deposited on the coating. In an embodiment, the coating includes, relative to the total weight of the coating, at least 25 wt % of one or more photocatalysts, for example at least 50 wt %, at least 75 wt %, at least 90 wt %, or at least 95 wt %. In an embodiment, the coating includes one or more photocatalysts, e.g. $TiO_2$.

In an embodiment, the present coating is hydrophilic and has a water contact angle of less than 15°, for example less than 10°, less than 8°, less than 6°, less than 3°, or about 0°. Water contact angles may be determined with a FTA 200 Dynamic Contact Angle Analyser (available from Camtel LTD, Elsworth, Cambridgeshire, UK) at room temperature. Hydrophilic coatings may avoid staining of the coated parts by an aqueous liquid in, for example, immersion lithography. The hydrophilic coating may prevent the formation of droplets and thereby prevent contaminants that may be present in the liquid from flowing to and concentrating around the perimeter of a droplet. The hydrophilicity of the coating may be photoinduced hydrophilicity (e.g. as a result of being or having been exposed to UV radiation) and may have a water contact angle of, for example, greater than 15° (e.g. greater than 20°) prior to invoking the photoinduced hydrophilicity. In an embodiment, the photoinduced hydrophilicity may be reversible (e.g., the coating may return to its comparatively hydrophobic state after not having received radiation for a certain period of time). In an embodiment, the hydrophilic coating is a titanium dioxide coating.

In an embodiment, the coating includes one or more metal oxides, for example titanium dioxide, zinc oxide, and/or zirconium dioxide. In an embodiment, the coating includes, relative to the total weight of the coating, at least 25 wt % of one or more metal oxides, for example at least 50 wt %, at least 75 wt %, at least 90 wt %, or at least 95 wt %. In an embodiment, the coating consists essentially of one or more metal oxides, for example $TiO_2$, $SrTiO_3$, $Fe_2O_3$, $ZnO$, $ZrO_2$, $WO_3$, or mixtures thereof.

In an embodiment, the present coating includes one or more semiconductors, for example $TiO_2$, $SrTiO_3$, $Fe_2O_3$, $WO_3$, $CdS$, or mixtures thereof. In an embodiment, the coating includes, relative to the total weight of the coating, at least 25 wt % of one or more semiconductors, for example at least 50 wt %, at least 75 wt %, at least 90 wt %, or at least 95 wt %.

In an embodiment, the coating includes one or more semiconductors. In an embodiment, the semiconductors are semiconductor photocatalysts.

The coating may be provided on a substrate by any suitable method or process. In an embodiment, the coating is applied by reactive magnetron sputtering. In another embodiment, the coating is applied by spin coating or dip coating. In an embodiment, the substrate is a glass substrate (e.g. a glass substrate that is partly coated with a metal, e.g. chromium) or a metal halide (e.g., $CaF_2$) substrate.

The coating may have any suitable thickness. In an embodiment, the thickness of the coating is at least 1 nm, for example at least 3 nm, at least 7 nm, at least 15 nm, at least 30 nm, at least 50 nm, at least 75 nm, at least 100 nm, at least 150 nm, or at least 250 nm. In an embodiment, the thickness of the coating is less than 10 μm, for example less than 7 μm, less than 4 μm, less than 2 μm, less than 1 μm, less than 750 nm, less than 500 nm, or less than 350 nm.

Having described specific embodiments of the present invention, it will be understood that many modifications thereof will readily appear or may be suggested to those skilled in the art, and it is intended therefore that this invention is defined by the following claims.

What is claimed is:

1. An extreme ultraviolet exposure apparatus comprising:
   a radiation system configured to supply a beam of extreme ultraviolet radiation;
   a support configured to support a patterning device, the patterning device configured to pattern the beam of extreme ultraviolet radiation according to a desired pattern;
   a substrate table having an area configured to support a substrate;
   a projection system configured to project the patterned beam of extreme ultraviolet radiation onto a target portion of the substrate, the projection system comprising a reflective optical system;
   wherein at least a part of the apparatus that during use of the apparatus is exposed to the beam of extreme ultraviolet radiation is coated with an outer coating, the outer coating comprising a metal oxide, or a photocatalyst, or a semiconductor selected from the group consisting of: $TiO_2$, $SrTiO_3$, $Fe_2O_3$, $WO_3$, and CdS, or any combination thereof, and wherein the part of the apparatus is part of the projection system or includes a sensor on the substrate table.

2. The extreme ultraviolet exposure apparatus according to claim 1, wherein the sensor comprises two transmission image sensors arranged at diagonally opposite positions of the substrate table, the two transmission image sensors being coated by the coating.

3. The extreme ultraviolet exposure apparatus according to claim 2, wherein the transmission image sensors determine vertical and horizontal positions of an aerial image of the projection system.

4. The extreme ultraviolet exposure apparatus according to claim 2, further comprising an alignment system, wherein the transmission image sensors comprise reference markers configured to be detected through the projection system by the alignment system to align the substrate table and the patterning device.

5. The extreme ultraviolet exposure apparatus according to claim 1, wherein the sensor comprises reflection image sensor, the reflective image sensor being coated by the outer coating.

6. The extreme ultraviolet exposure apparatus according to claim 1, wherein the beam of extreme radiation has a wavelength of 5 to 20 nm.

7. The extreme ultraviolet exposure apparatus according to claim 1, wherein the outer coating comprises titanium dioxide.

8. The extreme ultraviolet exposure apparatus according to claim 7, wherein the outer coating comprises, relative to the total weight of the coating, at least 50 wt % titanium dioxide.

9. The extreme ultraviolet exposure apparatus according to claim 1, wherein the outer coating consists of at least one material selected from the group consisting of: $TiO_2$, $SrTiO_3$, $Fe_2O_3$, ZnO, $ZrO_2$, $WO_3$, and CdS.

10. The extreme ultraviolet exposure apparatus according to claim 9, wherein the outer coating comprises, relative to the total weight of the coating, at least 95 wt % of the at least one material selected from the group consisting of: $TiO_2$, $SrTiO_3$, $Fe_2O_3$, ZnO, $ZrO_2$, $WO_3$, and CdS.

11. The extreme ultraviolet exposure apparatus according to claim 1, wherein the outer coating has a thickness in the range of about 1 to 500 nm.

12. The extreme ultraviolet exposure apparatus according to claim 11, wherein the outer coating has a thickness in the range of about 15 to 100 nm.

13. The extreme ultraviolet exposure apparatus according to claim 1, wherein the outer coating comprises a semiconductor; and a metal oxide or a photocatalyst.

14. A projection system configured to project a beam of extreme ultraviolet radiation onto a target portion of a substrate, the projection system comprising a reflective optical system, wherein at least part of the projection system is provided with an outer coating comprising a metal oxide, or a photocatalyst, or a semiconductor selected from the group consisting of: $TiO_2$, $SrTiO_3$, $Fe_2O_3$, $WO_3$ and CdS, or any combination thereof.

15. The projection system according to claim 14, wherein the outer coating comprises titanium dioxide.

16. The projection system according to claim 15, wherein the outer coating comprises, relative to the total weight of the coating, at least 50 wt % titanium dioxide.

17. The projection system according to claim 14, wherein the outer coating consists of at least one material selected from the group consisting of: $TiO_2$, $SrTiO_3$, $Fe_2O_3$, ZnO, $ZrO_2$, $WO_3$, and CdS.

18. The projection system according to claim 17, wherein the outer coating comprises, relative to the total weight of the coating, at least 95 wt % of the at least one material selected from the group consisting of: $TiO_2$, $SrTiO_3$, $Fe_2O_3$, ZnO, $ZrO_2$, $WO_3$, and CdS.

19. The projection system according to claim 14, wherein the outer coating has a thickness in the range of about 1 to 500 nm.

20. The projection system according to claim 19, wherein the outer coating has a thickness in the range of about 15 to 100 nm.

21. The projection system according to claim 14, wherein the outer coating comprises a semiconductor; and a metal oxide or a photocatalyst.

22. A device manufacturing method in an extreme ultraviolet lithographic apparatus comprising at least a part that is coated with an outer coating, the outer coating comprising a metal oxide, or a photocatalyst, or a semiconductor selected from the group consisting of: $TiO_2$, $SrTiO_3$, $Fe_2O_3$, $WO_3$, and CdS, or any combination thereof, the method comprising:
   supporting a substrate on a substrate table comprising a sensor;

projecting a patterned beam of extreme ultraviolet radiation onto a target portion of the substrate with a projection system; and exposing the part to a beam of extreme ultraviolet radiation, wherein the part is part of the projection system or includes the sensor.

* * * * *